United States Patent [19]
Hirano et al.

[11] Patent Number: 5,422,854
[45] Date of Patent: Jun. 6, 1995

[54] SENSE AMPLIFIER FOR RECEIVING READ OUTPUTS FROM A SEMICONDUCTOR MEMORY ARRAY

[75] Inventors: Tetsuo Hirano, Anjo; Takahiro Yanagi, Kariya; Hiroaki Tanaka, Okazaki, all of Japan

[73] Assignee: Nippondenso Co., Ltd., Kariya, Japan

[21] Appl. No.: 104,912

[22] Filed: Aug. 12, 1993

[30] Foreign Application Priority Data

Aug. 13, 1992 [JP] Japan .................. 4-216140

[51] Int. Cl.$^6$ .............................................. G11C 7/00
[52] U.S. Cl. ...................... 365/210; 365/207; 365/185
[58] Field of Search ............... 365/210, 205, 207, 208, 365/185; 307/530

[56] References Cited

U.S. PATENT DOCUMENTS

| | | | |
|---|---|---|---|
| 5,148,063 | 9/1992 | Hotta | 365/210 |
| 5,241,505 | 8/1993 | Hashimoto | 365/210 |
| 5,258,959 | 11/1993 | Dallabora et al. | 365/210 |

FOREIGN PATENT DOCUMENTS 58-125282  7/1983  Japan .
58-125283  7/1983  Japan .

Primary Examiner—Joseph A. Popek
Attorney, Agent, or Firm—Cushman, Darby & Cushman

[57] ABSTRACT

Output signals, representing data read out from a memory cell array comprising a plurality of memory cells arranged in a matrix of m rows and n columns, each cell comprising an EPROM transistor, are fed to a sense amplifier. A row of the memory cell array is selected by signals SR1–SRm coming from a row decoder. The output of the selected row is taken out by a column select transistor selected by signals SC1–SCn from a column decoder before being fed to the sense amplifier. The sense amplifier comprises a memory cell output detecting circuit having a first load transistor for receiving output read out from the memory cell array and a dummy cell output detecting circuit having a second load transistor to which dummy cell equivalent to the memory cell is connected. The circuit of the first load transistor and that of the second load transistor form a current mirror circuit. The sense amplifier also comprises a sense amplifier output evaluation circuit having differential amplifiers which transmit output voltages of the memory cell output detecting circuit and of the dummy cell output detecting circuit to reflect the respective currents running through the first and second load transistors.

16 Claims, 10 Drawing Sheets

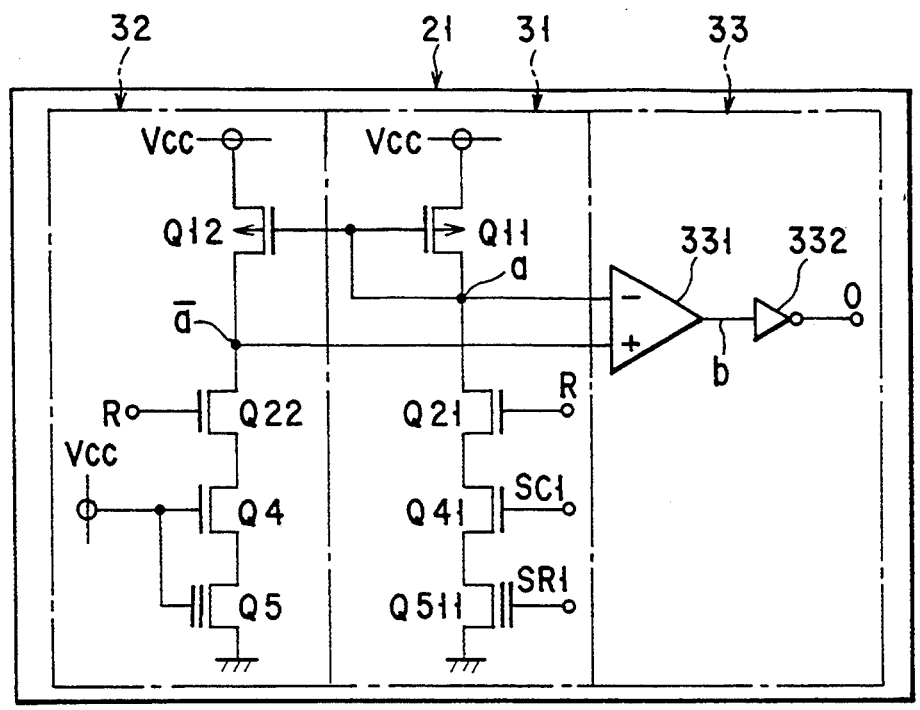
F I G. 2
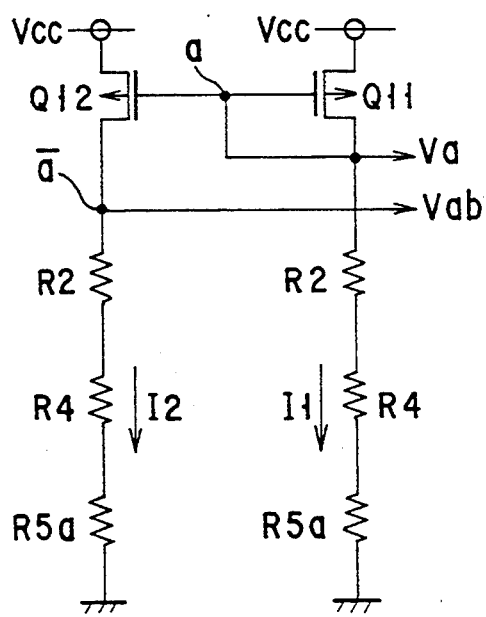
(DUMMY)   (MEMORY CELL)
F I G. 3A
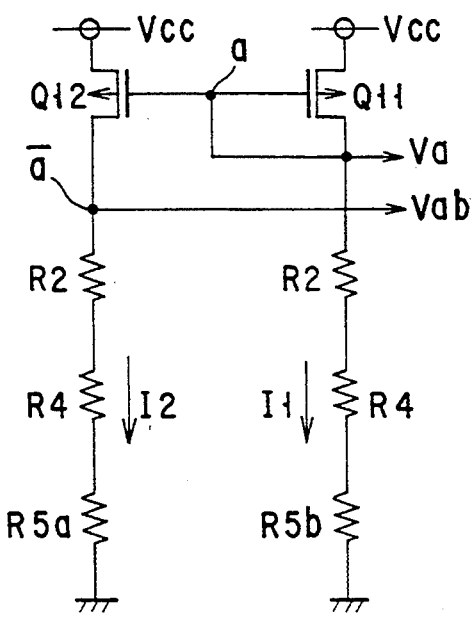
(DUMMY)   (MEMORY CELL)
F I G. 3B

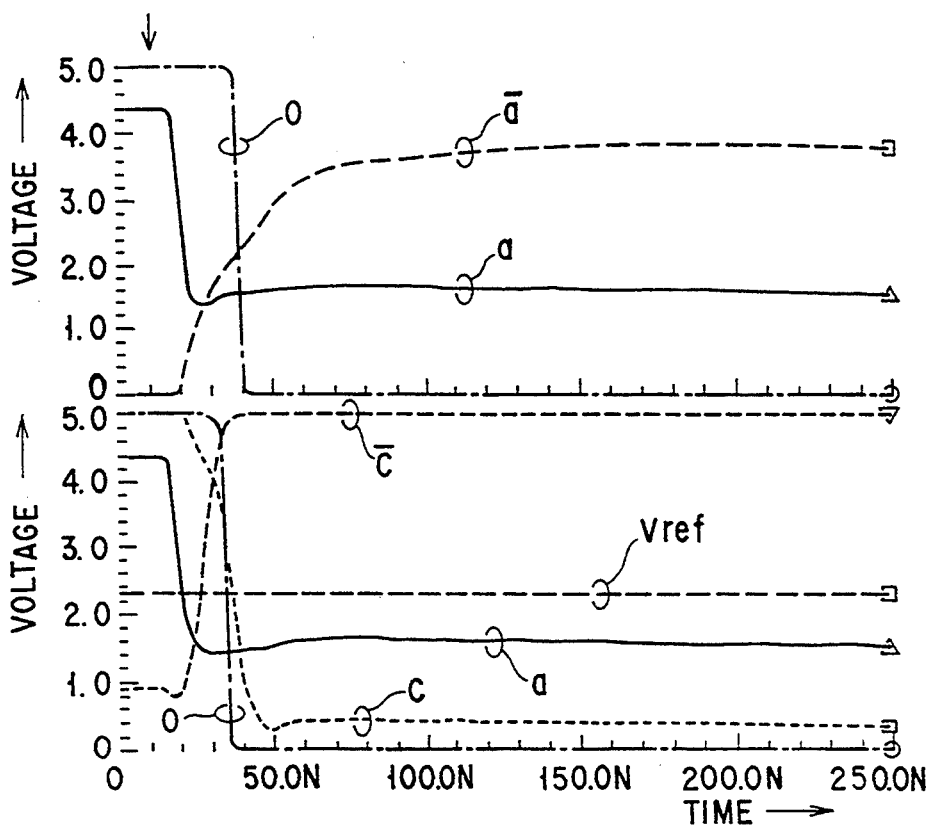
FIG. 4A
FIG. 4B
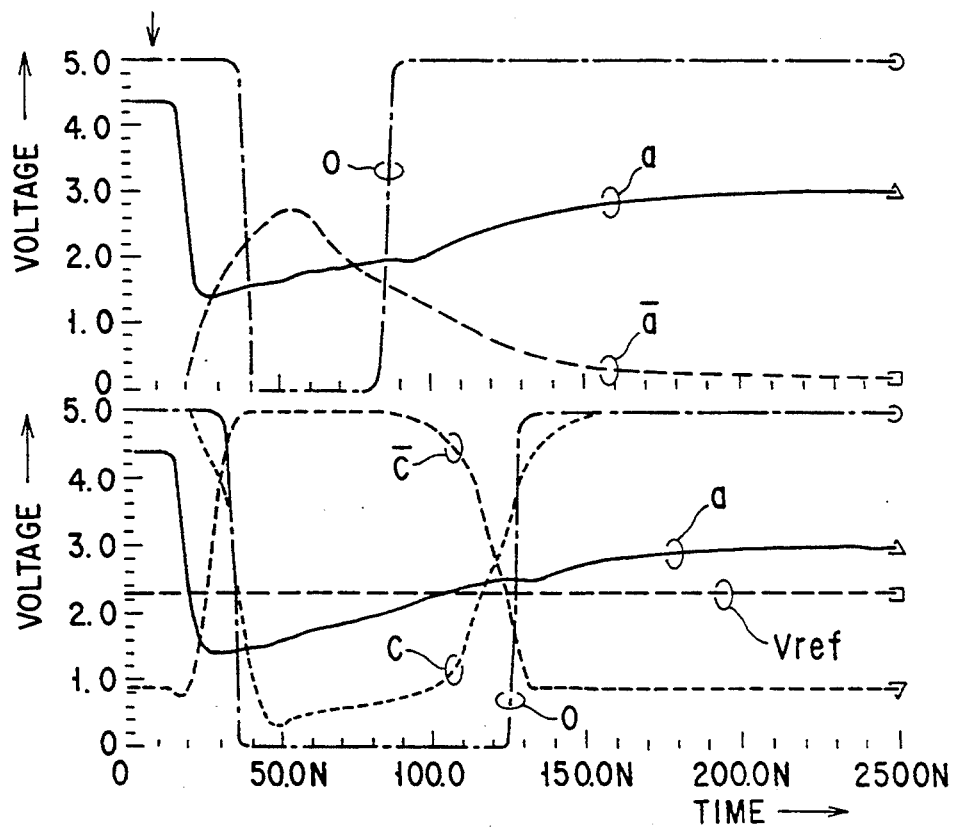
FIG. 5A
FIG. 5B

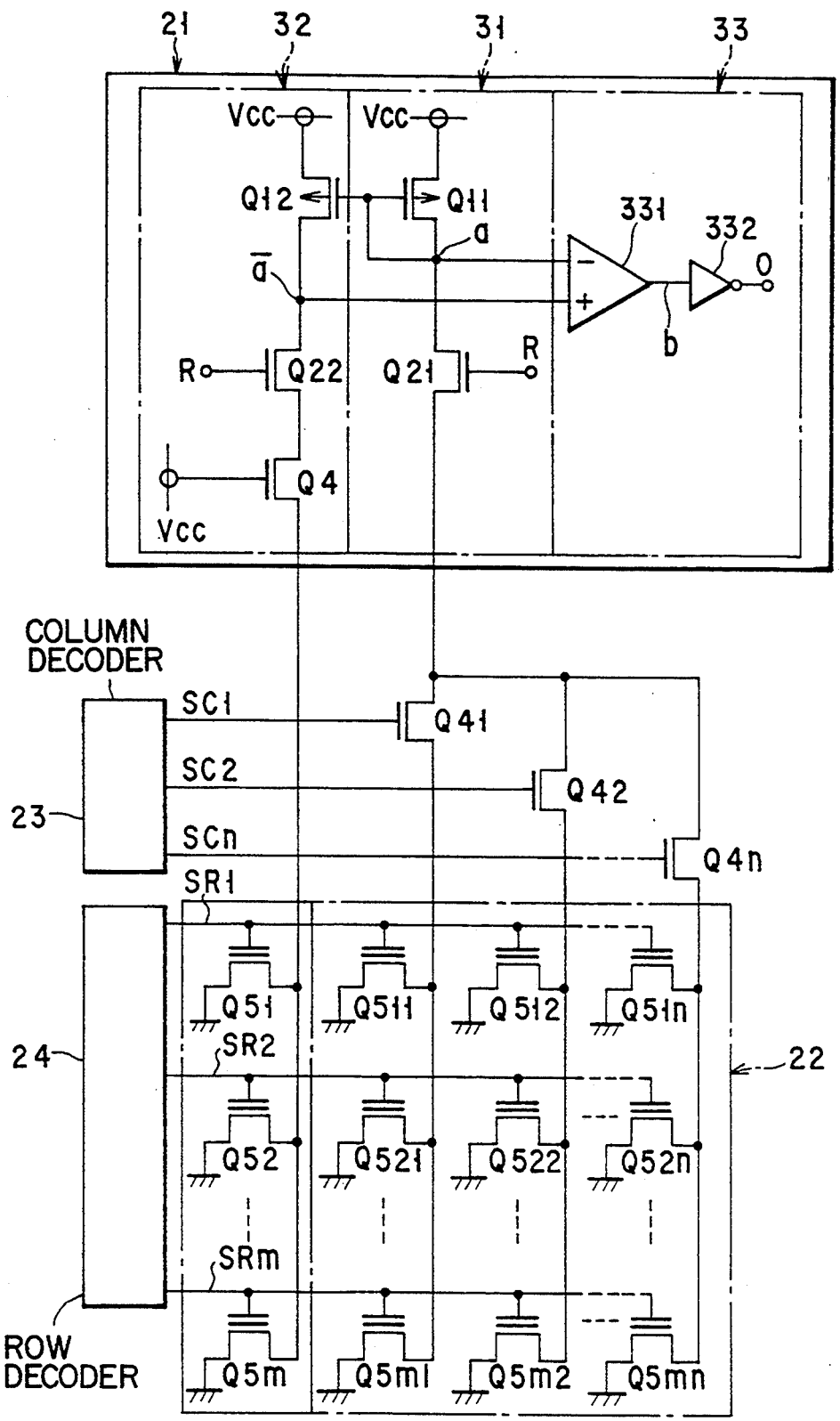
F I G. 6

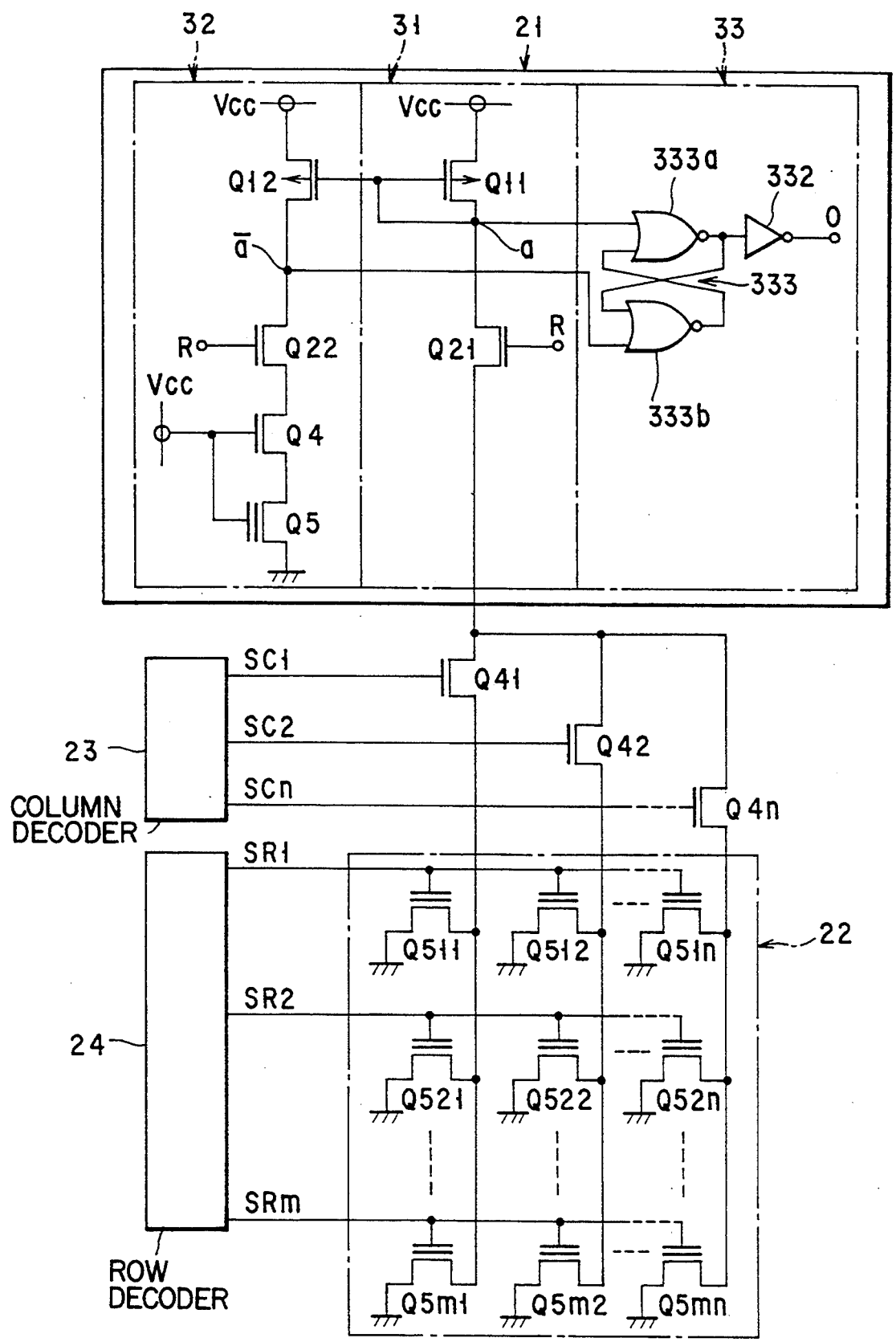
F I G. 7

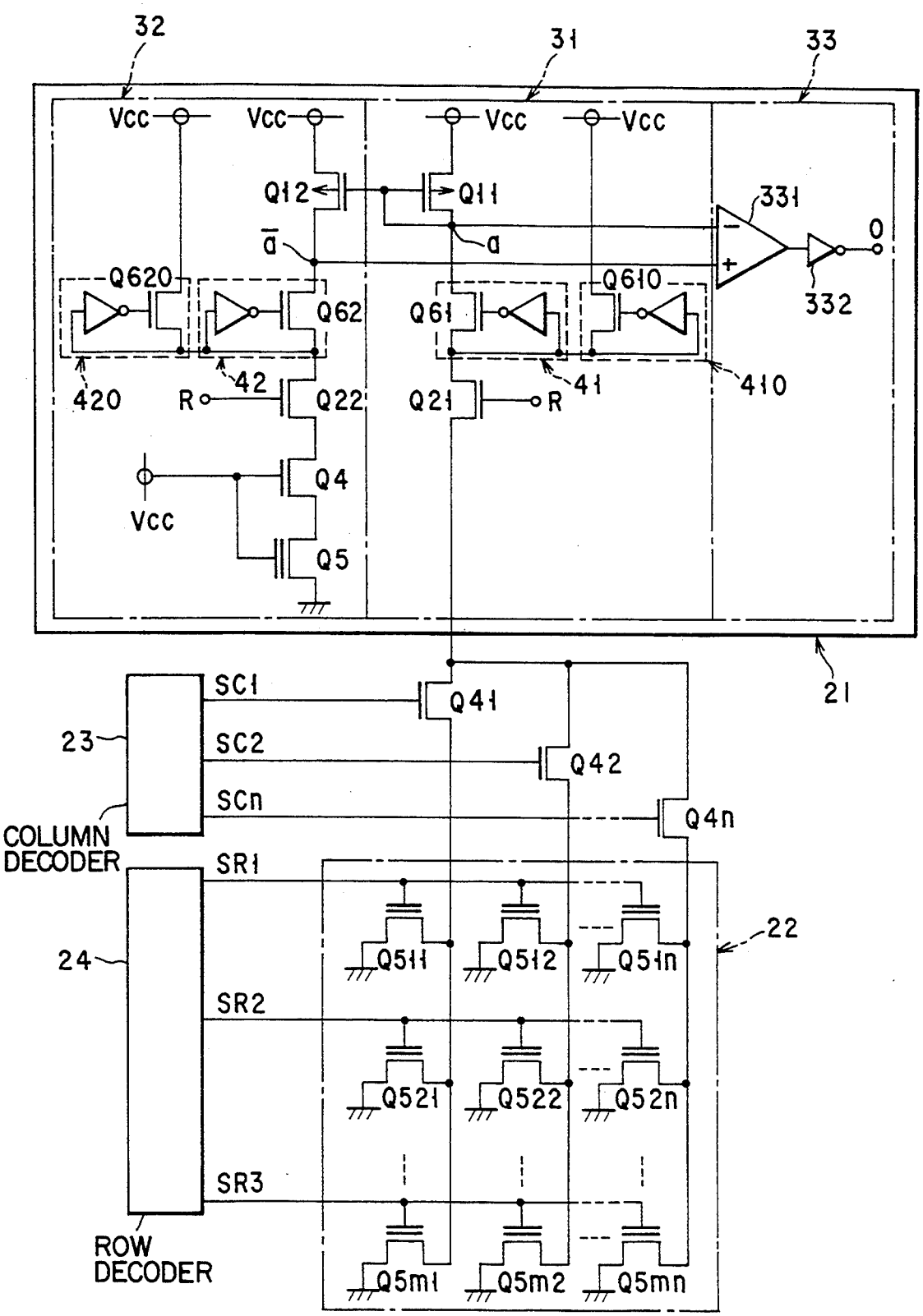
F I G. 9

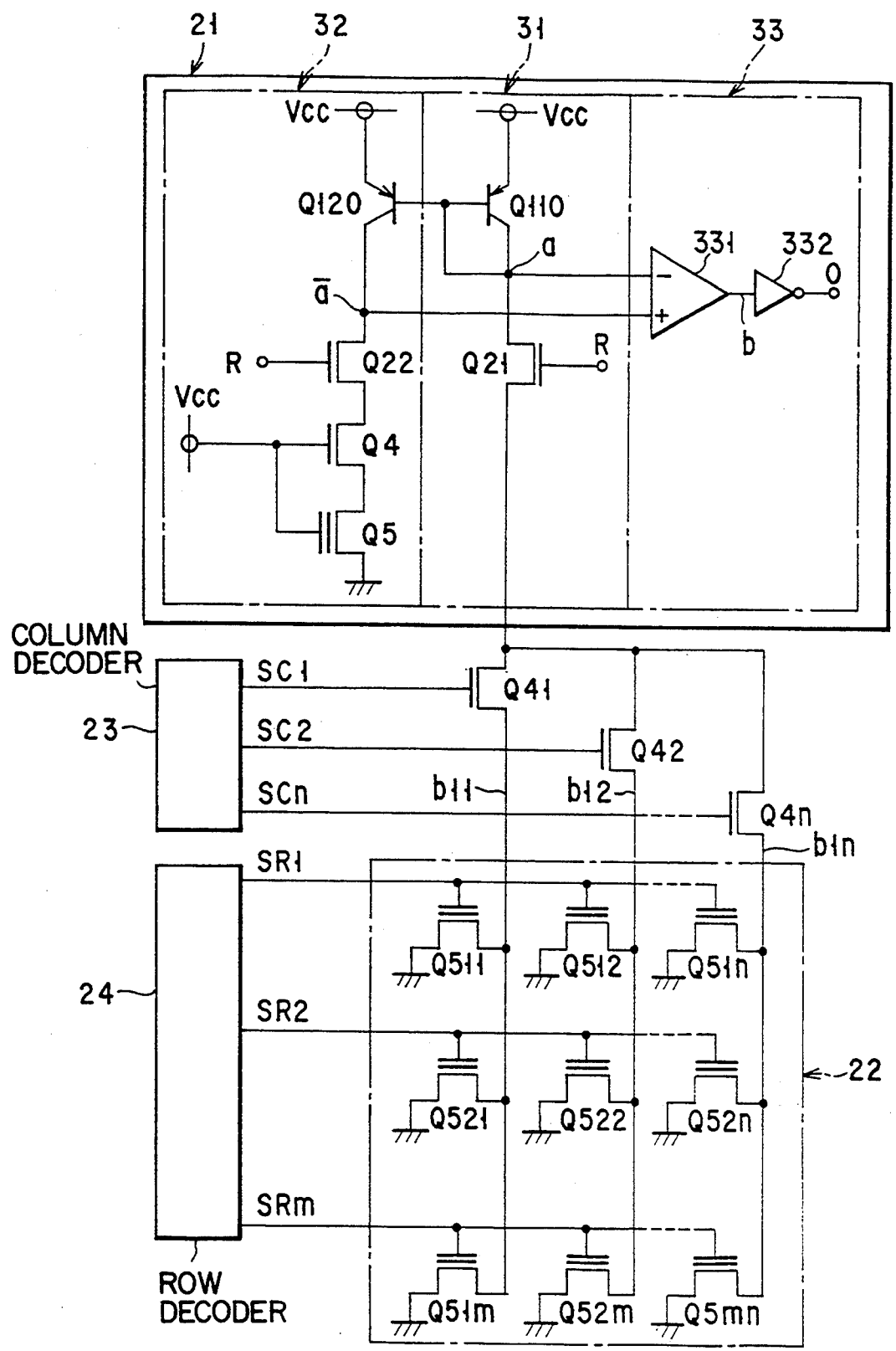
F I G. 11

SENSE AMPLIFIER FOR RECEIVING READ OUTPUTS FROM A SEMICONDUCTOR MEMORY ARRAY

BACKGROUND OF THE INVENTION

1. Field of the Invention

This invention relates to a sense amplifier for receiving signals of data read out from a semiconductor memory cell array and operating as a component of a read circuit for reading and transmitting data stored in a semiconductor memory such as an EPROM, EEPROM or mask ROM.

2. Description of the Related Art

Jpn. Pat. Appln. DOKAI Publication No. 58-125282 discloses a read circuit for a semiconductor memory having a configuration as illustrated in FIG. 12 of the accompanying drawings. A semiconductor memory of the type under consideration is normally provided with a memory cell array 11 comprising a number of memory cells $Q5_{ll}$–$Q5_{mn}$ in a matrix of m rows and n columns, of which a row can be selected by a corresponding signal of row select signals SR1–SRm transmitted from a row decoder 12. Output of each of the rows of the memory cell array 11 are collectively sent to column select transistors $Q4_l$–$Q4_n$, one of which is then selected by a corresponding signal of column section signals SC1–SCn transmitted from a column decoder 13. The output of a specific memory cell may then be selectively read out by the row decoder 12 and the column decoder 13. The signal representing the data read out from a selected one of the memory cells of the memory cell array 11 is then fed to a sense amplifier 14. The sense amplifier 14 comprises a load transistor Q1 constituted by a P-channel MOS transistor and a memory cell output detection circuit 15, which in turn is constituted by a read/write switching transistor Q2 for receiving read/write switching signal R. The output signal from the memory cell array 11 is fed to the load transistor Q1 by way of the read/write switching transistor Q2.

Output a from the output terminal of the memory cell output detection circuit 15 is then fed to both the non-inversion side input terminal of a differential amplifier 16a, and the inversion side input terminal of a differential amplifier 16b. These differential amplifiers 16a and 16b individually compare the output they receive with a reference voltage vref. Then, the properly phased output c and the inversely phased output $\overline{c}$ from the differential amplifiers 16a and 16b are compared with each other by a differential amplifier 17. Their phases are inverted by an inverter 18 before they are taken out through an output terminal O as output of the sense amplifier.

Thus, a total of three differential amplifiers need to be installed in a sense amplifier having a configuration as described above, inevitably making the size of the overall circuit rather large. Additionally, since the differential amplifiers 16a and 16b are connected to respective signal transmission paths between the output terminal of the memory cell output detection circuit 15 and the differential amplifier 17 to compare their output, the delay time in the response of the differential amplifiers 16a and 16b is added to the time required for a specific data to be read out of the memory cell array. Consequently, the overall time required for a data reading operation is increased.

SUMMARY OF THE INVENTION

It is therefore an object of the present invention to provide a sense amplifier for a semiconductor memory having a rapid data reading ability with a relatively simple configuration to produce inversely-phased output signals. Further, these output signals are realized without connecting a circuit that may cause any delay in response to the signal transmission paths between an output terminal of a memory cell array of the memory and a differential amplifier circuit for output evaluation.

It is another object of the present invention to provide a sense amplifier for a semiconductor memory having a rapid data reading ability. This ability is realized without inserting any additional circuitry which may cause a delay in signal transmission between an output terminal of a sense amplifier and a differential amplifier unit for output evaluation. Any change in the output signal of the semiconductor memory may thus trigger instant generation of an inversely-phased signal for the output signal and the sense amplifier may quickly receive signals for data read out from the semiconductor memory.

It is a further object of the present invention to provide a sense amplifier capable of quickly reading data from the memory cells of a semiconductor memory without using a complicated circuit configuration.

According to the invention, the above-stated and other objects of the invention are achieved by providing a sense amplifier for receiving signals of data read out from a semiconductor memory. The semiconductor memory comprises a memory cell output detecting means having a first load transistor connected to the output terminal of the semiconductor memory cell array of the memory, a dummy cell output detecting means having a second load transistor connected to a output of a dummy cell, which is equivalent to said semiconductor memory cell, and a sense amplifier output evaluation means connected to both the output signal of said dummy cell output detecting means the output signal of said memory cell output detecting means. The output signal of said dummy cell output detecting means provides an output signal having a phase inverse to that of a corresponding output signal from the output of the memory cell output detecting means. The sense amplifier output evaluation means amplifies the difference voltage of the output signal of the dummy cell output detecting means and the output signal of the memory cell output detecting means.

In a sense amplifier of a semiconductor memory having a configuration as described above, the first load transistor for receiving output signals from the memory cell array and the second load transistor for receiving output signals from the dummy cell are typically arranged to form a current mirror circuit for producing an output signal a having a phase same as that of an input signal and another output signal $\overline{a}$ having a phase inverse to that of the input signal. Both output signals are then fed to an output evaluation means typically comprising a differential amplifier. Since the signals are transmitted without delay in the sense ampiifier by a current mirror circuit before they get to the output evaluation means, the sense amplifier is capable of quickly reading data from a semiconductor memory without requiring a large circuit configuration.

Now, the present invention will be described with reference to the accompanying drawings which illustrate preferred embodiments of the invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram illustrating a condition where a memory cell of the semiconductor memory is selected for data retrieval;

FIGS. 3A and 3B are circuit diagrams of an equivalent circuit of a memory cell of the first embodiment for illustrating the operation of the embodiment in a data erased status and in a data written-in status, respectively;

FIGS. 4A and 4B graphs for comparing an output of a memory cell of the first embodiment and that of a memory cell of a conventional memory in a data erased status;

FIGS. 5A and 5B are graphs for comparing an output of a memory cell of the first embodiment and that of a memory cell of a conventional memory in a data written in status;

FIG. 6 is a circuit diagram of a second embodiment of the invention;

FIG. 7 is a circuit diagram of a third embodiment of the invention;

FIG. 9 is a circuit diagram of a fourth embodiment of the invention;

FIG. 11 is a circuit diagram of a sixth embodiment of the invention; and

DETAILED DESCRIPTION OF THE PREFERRED EMBODIMENTS

Figure 1:
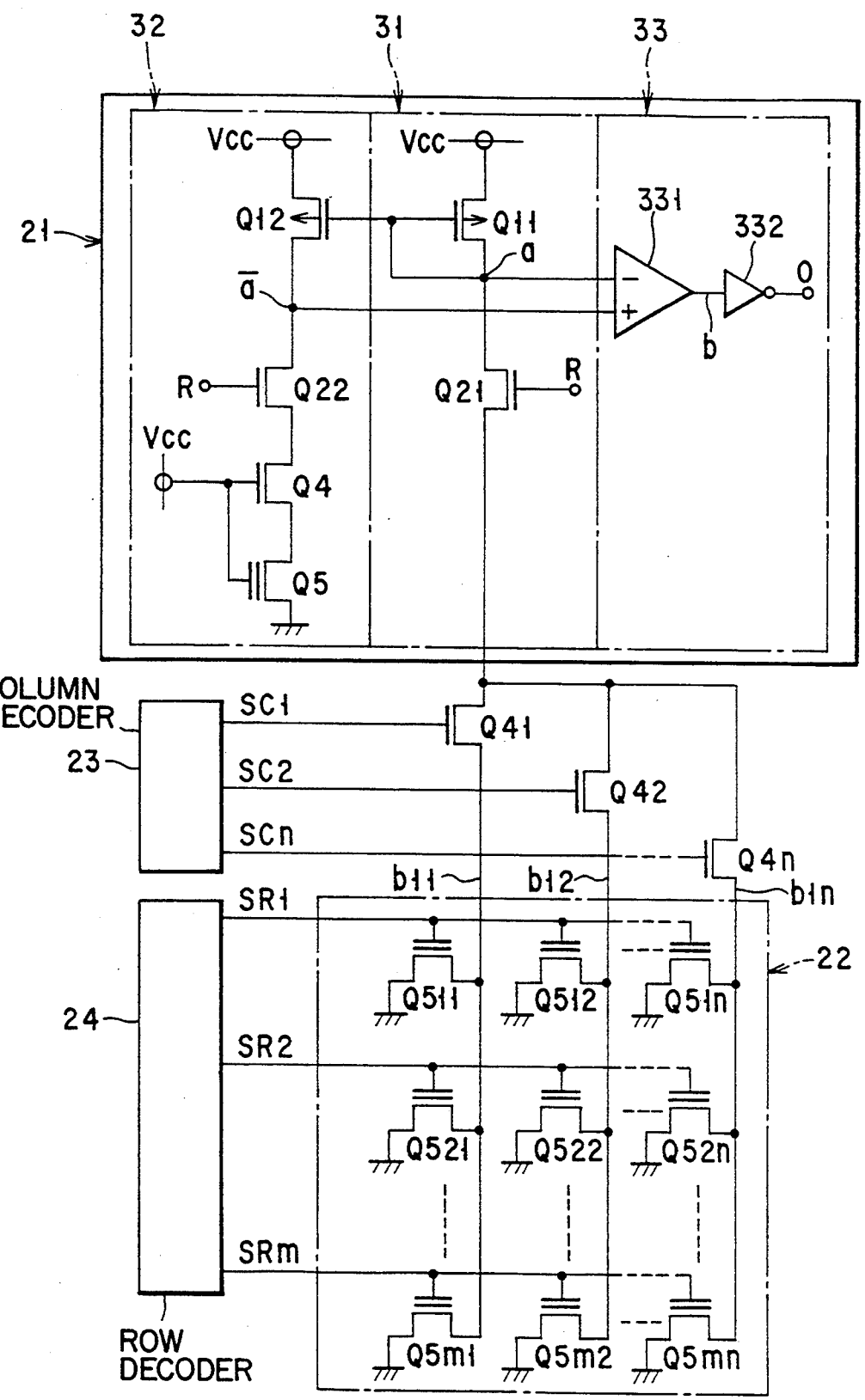
FIG. 1 is a circuit diagram of a semiconductor memory circuit incorporating a first embodiment of a sense amplifier circuit according to the invention.

FIG. 1 is a circuit diagram of a first embodiment of a sense amplifier. A sense amplifier 21 is used here for receiving data read out from the memory cell array 22 of a semiconductor memory, which is an EPROM (a memory which allows data to be electrically written and erased with ultraviolet rays).

The EPROM comprises a memory cell array 22 constituted by a total of m×n EPROM transistors $Q5ll$-$Q5mn$ arranged in a matrix of m rows and n columns. The rows of the transistors of the memory cell array 22 are connected to respective common bit lines $bll$-$bln$, which in turn are connected to respective column select transistors $Q4l$-$Q4n$. The source electrode of each of the transistors $Q5ll$-$Q5mn$ is grounded.

Each of the EPROM transistors $Q5ll$-$Q5mn$ of the memory cell array 22 is either in a data written-in status (with a threshold voltage Vt greater than 4.5V) for data "1" or in a data erased status (with a threshold voltage approximately equal to 1.5v) for no data or data "0". Column select signals SC1-SCn from a column decoder 23 are supplied to the respective gate electrodes of the column select transistors $Q4l$-$Q4n$, using read signals from the respective columns of the memory cell array 22. One of the columns of the memory cell array 22 is consequently selected by the column select signals SC1-SCn. The signal from the selected one of the column select transistors $Q4l$-$Q4n$ is then fed to the sense amplifier 21.

The gate electrodes of each row of the EPROM transistors $Q5ll$-$Q5mn$ are connected together, and row select signals SR1-SRm from a row decoder 24 are transmitted to the respective rows of transistors. Thus, an EPROM transistor can be singled out from the memory cell array 22 by using row select signals from the row decoder 24 and column select signals from the column decoder 23. The data, if any, stored in the selected transistor is taken out from it by way of the selected column select transistor and fed to the sense amplifier 21.

The sense amplifier 21 comprises a memory cell output detecting circuit 31 to which output of the memory cell array 22 is supplied, a dummy cell output detecting circuit 32, and a sense amplifier output evaluation circuit 33, to which output signals of the memory cell output detecting circuit 31 and the dummy cell output detecting circuit 32 are supplied.

The memory cell output detecting circuit 31 and the dummy cell output detecting circuit 32 respectively comprise first and second load transistors Q11 and Q12, each of which is a P-channel MOS transistor having its source electrode connected to a power source Vcc (5V). The first and second load transistors Q11 and Q12 are connected in series with each other also with respective read/write switching transistors Q21 and Q22. The gate electrodes of the transistors Q21 and Q22 receive read/write switching signals R.

Additionally, the transistor 21 is designed to receive the output of a column of transistors of the memory cell array 22 selected by one of the column select transistors $Q4l$-$Q4n$ so that memory cell output a may be taken out from the junction of the first load transistor Q11 and the switching transistor Q21.

On the other hand, the dummy cell output detecting circuit 32 comprises a dummy EPROM transistor Q5 having its source electrode held to the ground potential and its gate electrode to a power source Vcc. A dummy column select transistor Q4 is connected in series with the dummy EPROM transistor Q5 such that the power source voltage Vcc is constantly applied to the gate of the dummy column select transistors Q4 and that of the dummy EPROM transistor Q5. The dummy EPROM transistor Q5 is connected to the second load transistor Q12 by way of the read/write switching transistor Q22 in such a manner that dummy cell output ā may be taken out from the junction of the load transistor Q12 and the read/write switching transistor Q22. The dummy EPROM transistor Q5 is constantly held in a data erased status (with a threshold voltage equal to 1.5v).

The gate electrode of the first load transistor Q11 of the memory cell output detecting circuit 31 and the gate electrode of the second load transistor Q12 of the dummy cell output detecting circuit 32 are connected with each other. The junction of the two gate electrodes is further connected to memory cell output a so that the memory cell output detecting circuit 31 and the dummy cell output detecting circuit 32 jointly form a current mirror circuit.

The sense amplifier output evaluation circuit 33 comprises a differential amplifier 331 having an inversion side input terminal for receiving output a of the memory cell output detecting circuit 31 and a non-inversion side input terminal for receiving dummy cell output ā of the dummy cell output detecting circuit 32. Output signal b of the differential amplifier 331 is phase inverted by an inverter circuit 332, which finally sends out output O of the sense amplifier.

As one of the column select signals SC1–SCn from the column decoder 23 and one of the row select signals SR1–SRm from the row decoder 24 of a semiconductor memory circuit having a configuration as described above get to a high level (voltage Vcc), an appropriate signal of the EPROM transistors of the memory cell array 22 is selected and the signal representing the data read out from the selected transistor is fed to the sense famplifier 21. Assume now, for instance, that column select signal SC1 and row select signal SR1 are set to a high level, and the output of the EPROM transistor Q5ll of the memory cell array 22 is connected to the source electrode of the read/write switching transistor Q21 of the memory cell output detecting circuit 31. Then, a current mirror circuit is realized by the EPROM transistor Q5ll and dummy EPROM transistor Q5.

FIG. 2 schematically illustrates the sense amplifier 21 when the EPROM transistor Q5ll is selected by a column select signal and a row select signal in a manner as described above. Now, the operation of reading data from the EPROM transistor Q5ll will be described.

Read/write switching signal R is set to a high level for reading data and both read/write switching transistors Q21 and Q22 are held in a conductive state. On the other hand, the dummy column select transistor Q4 is constantly maintained on and the dummy EPROM transistor Q5 is kept in a data erased status while the power source voltage Vcc is constantly applied to the gate electrode so that the transistor Q5 is also kept on.

If both column select signal SC1 and row select signal SR1 are set to a high level respectively by the column decoder 23 and the row decoder 24 under this condition, the column select transistor Q41 is turned on. Then, both the current running into the EPROM transistor Q5ll and the current running into the dummy EPROM transistor Q5 that forms a current mirror circuit with the transistor Q5ll would change depending on whether the selected EPROM transistor Q5ll is in a data written-in status or in a data erased status. The transistors are thus caused to respectively produce memory cell output a and dummy cell output ā having voltage levels that are inverse to each other.

FIGS. 3A and 3B are circuit diagrams of an equivalent circuit shown there to illustrate the above condition of the embodiment, where the read/write switching transistors Q21 and Q22, the column select transistor Q41, the dummy column select transistor Q4, the EPROM transistor Q5ll, the dummy EPROM transistor Q5, and other components are respectively replaced by equivalent resistors. The operation of the embodiment will firstly be described for a condition where the selected EPROM transistor Q5ll of the memory cell array 22 is in a data erased status by referring to FIG. 3A.

Assuming that current I1 runs through the memory cell side to which the EPROM transistor Q5ll belongs, whereas current I2 runs through the dummy cell side to which the dummy EPROM transistor Q5 belongs, since both the first and the second load transistors Q11 and Q12 are connected to the current mirror circuit, the level of the current I2 is defined by the width W and the length L of the first load transistor Q11 and those of the second load transistor Q12. If the gate widths of the load transistors Q11 and Q12 are WQ1 and WQ2, respectively (LQ1=LQ2=L), then current I2 will be expressed by formula (1) below.

$$I2 = (WQ2/L)/(WQ1/L) \cdot I1 \quad (1)$$
$$= WQ2/WQ1 \cdot I1$$

Then, output voltage Va of memory cell output a is expressed by formula (2) below.

$$Va = (R2+R4+R5a).I1 \quad (2)$$

And, output voltage Vab of dummy cell output ā is expressed by formula (3) below.

$$\begin{aligned} Vab &= (R2 + R4 + R5a) \cdot I2 \\ &= (R2 + R4 + R5a) \cdot (WQ2/WQ1) \cdot I1 \\ &= (WQ2/WQ1) \cdot Va \end{aligned} \quad (3)$$

From expression (3), if the relationship between the gate width WQ2 of the second load transistor Q12 of the dummy EPROM transistor Q5 side and the gate width WQ1 of the first load transistor Q11 of the EPROM transistor Q5ll side is expressed by formula (4) below, $$WQ2 > WQ1 \quad (4)$$

(or (WQ2/LQ2)>(WQ1/LQ1) if the gate length LQ1 of the transistor Q11 is not equal to the gate length LQ2 of the transistor Q12), then the following expression holds true when the EPROM transistor Q5ll is in a data erased status.

$$Va < Vab \quad (5)$$

Now, the operation of the embodiment when the selected EPROM transistor Q5ll is in a data written-in status will be described by referring to FIG. 3B. Since the threshold voltage level of the EPROM transistor Q5ll is high (Vt>4.5v) and only a weak current runs through the transistor Q5ll, it is virtually off even though it is actually turned on. The resistance of the equivalent on resistor R5b of the circuit is therefore sufficiently high relatively to the on resistor R5a in a data erased status (R5b>R5a). Consequently, the dummy cell output voltage Vab in a data written-in status will be expressed by equatio(6) below.

$$\begin{aligned} Vab &= (R2 + R4 + R5a) \cdot I2 \\ &= (R2 + R4 + R5a) \cdot (WQ2/WQ1) \cdot I1 \\ &= (R2 + R4 + R5a)/(R2 + R4 + R5b) \cdot \\ &\quad (WQ2/WQ1) \cdot Va \end{aligned} \quad (6)$$

Thus, by determining the ratio (WQ2/WQ1) (or the ratio (WQ2/LQ2)/(WQ1/LQ1)) so as to satisfy both the requirement of formula (4) and that of formula (7) below $$(R2+R4+R5b) > (R2+R4+R5a)\cdot(WQ2/WQ1) \quad (7)$$

the relationship between Va and Vab for the EPROM transistor Q5ll in a data written-in status will be defined by formula (8) below.

$$Va > Vab \quad (8)$$

Thus, output voltage Va of memory cell output a and output voltage Vab of dummy cell output ā become inverted and remain inverse relative to each other depending on whether the selected EPROM transistor Q5ll of the memory cell array 22 is in a data erased status or in a data writtenin status. So, output O of the sense amplifier 21 can be obtained by amplifying output a of the memory cell output detecting circuit 31 and output ā of the dummy cell output detecting circuit 32, with the differential amplifier 331 and the inverter circuit 332.

FIGS. 4A, 4B, 5A and 5B are graphs for comparing output of a memory cell of the first embodiment and those of a memory cell of a conventional memory in a data erased status and in a data written-in status. Note that FIGS. 4A and 5A are for the first embodiment of FIG. 1 in a data erased status and in a data written-in status, respectively, whereas FIGS. 4B and 5B are for the conventional memory of FIG. 12 in a data erased status and in a data written-in status, respectively.

Since the EPROM transistor Q5ll is on whenever it is in a data erased status, it discharges an electric charge of the bit line b11, attributable to its parasitic capacitance, to determine the condition of memory cell output a. Therefore, the time tacc required for the sense amplifier 21 of the invention to read out output O (the time between when an address is set in the column decoder and the row decoder and when a low level is established for output O) is not significantly different from the time tacc required for the sense amplifier 21 of the prior art.

when the EPROM transistor Q5ll is in a data written-in status, however, it remains virtually off. Therefore, it does not do anything for electrically charging the bit line b11 due to its parasitic capacitance and the latter is charged with electricity only gradually by the first load transistor Q11.

In the sense amplifier 21 of the prior art where differential amplifiers 16a and 16b are inserted between the memory output and the output evaluation differential amplifier 17, output c and c̄ may be produced by the differential amplifiers 16a and 16b, respectively, or vice verse depending on whether the voltage of memory output a exceeds a reference voltage Vref. The time tacc required to read out output O (or the time from when an address is set in the amplifiers 16a and 16b until when a high level established for output O) inevitably becomes long because it includes the time for the voltage of memory cell output a to exceed the reference voltage Vref, as well as the response delay of the differential amplifiers 16a and 16b before they produce output c with a proper phase and output c̄ with an inverted phase.

In contrast, in the sense amplifier 21 of the invention, an inverted phase output ā can be produced instantly each time a memory cell output a undergoes a change, because of the current mirror circuit formed by the EPROM transistor Q5ll and the dummy EPROM transistor Q5, without causing any delay to appear between output a of the sense amplifier and the output evaluation differential amplifier 331.

Figure 12:
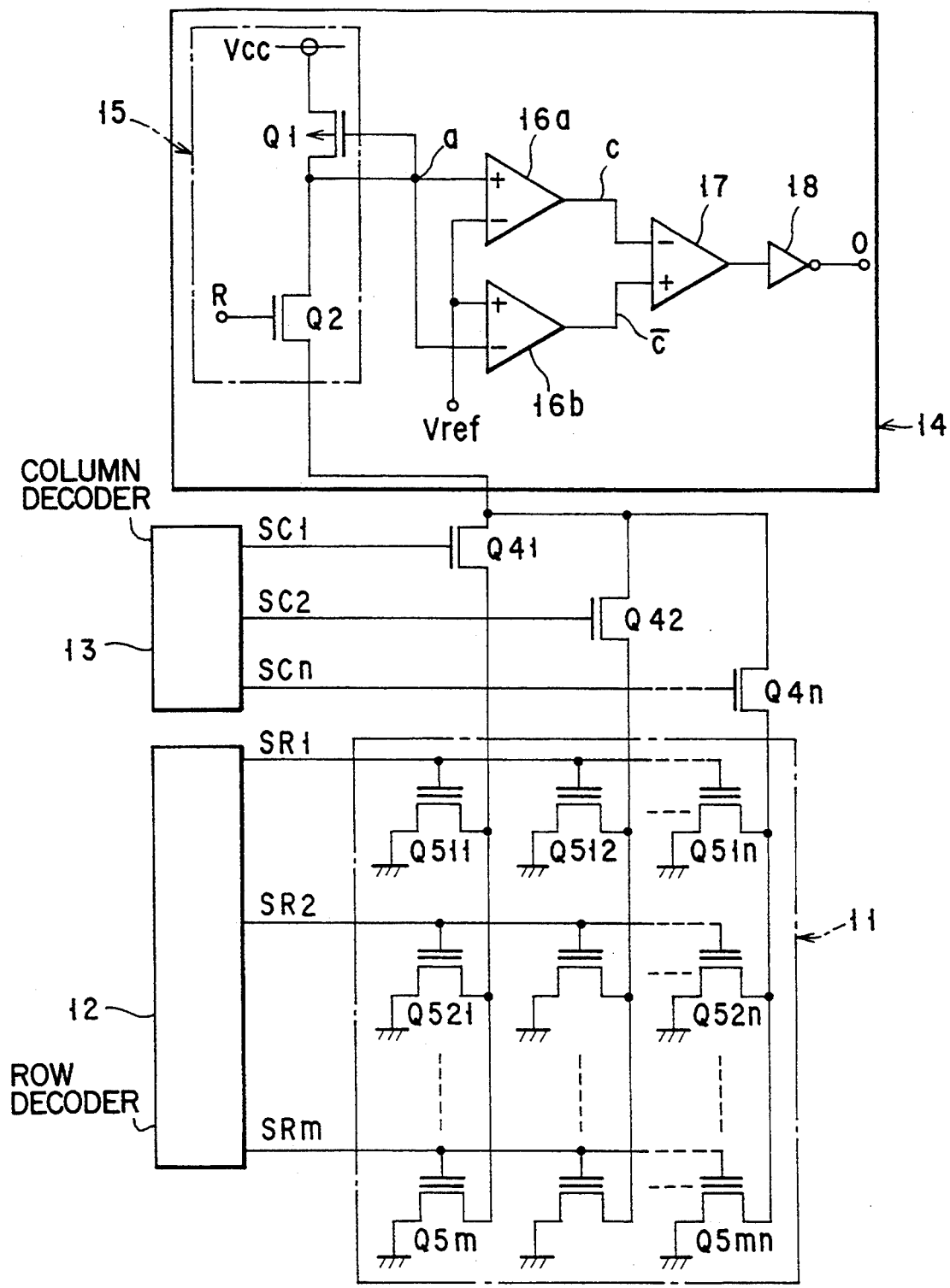
FIG. 12 is a circuit diagram of a conventional sense amplifier connected to a memory cell array.

Thus, it may be apparent that the above described embodiment can produce the output ā having a phase inverse to that of memory cell output a with a configuration significantly simpler than that of the prior art sense amplifier of FIG. 12. Additionally, according to the first embodiment, data stored in the memory cell array 22 can be quickly read out by using memory cell output a and having a phase inverse to that of output ā, and amplifying them by a differential amplifier 331.

FIG. 6 is a schematic circuit diagram of a second embodiment of the invention, wherein dummy EPROM transistors Q5l-Q5m are arranged to accommodate respective rows of a memory cell array 22 such that one of the transistors may be selected by using row select signals SR1-SRm from a row decoder 24. In other words, a dummy EPROM transistors are selected and connected to a dummy column select transistor Q4 of a dummy cell output detecting circuit 32 in response to the selection of a row of the memory cell array 22.

Figure 8A:
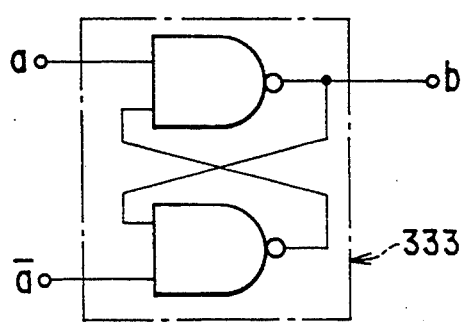
FIGS. 8A through 8C are circuit diagrams for alternative latch circuits which can be used for the third embodiment.
Figure 8B:
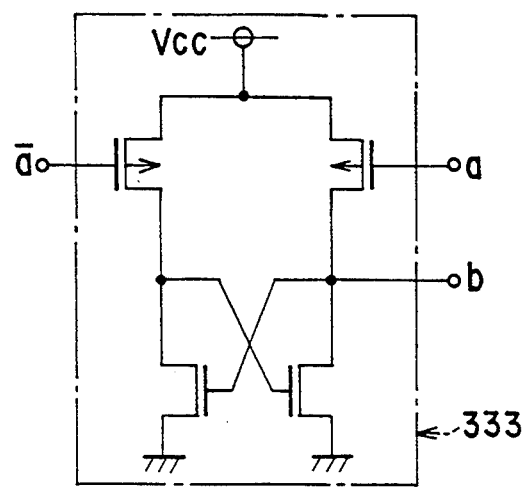
Figure 8C:
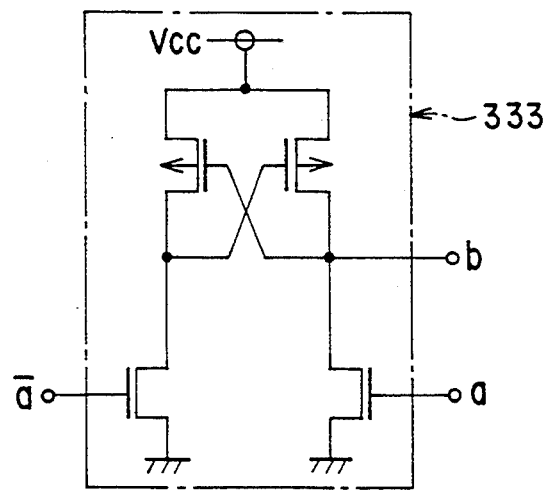

FIG. 7 is a circuit diagram of a third embodiment of the invention, wherein a sense amplifier output evaluation circuit 33 is formed by a latch circuit 333 comprising a pair of NOR-circuits 333a and 333b such that memory cell a output and dummy cell output ā may be fed to the latch circuit 333, and the output of the latch circuit 333 is subsequently fed to an inverter circuit 332. The latch circuit 333 may have various configurations, including those shown in FIGS. 8A through 8C, each of which is designed to receive memory cell output a and dummy cell output ā and to transmit a corresponding output to an inverter circuit 332.

FIG. 9 is a circuit diagram of a fourth embodiment, which comprises current sense circuits 41 and 42 respectively formed by using N-channel MOS transistors Q61 and Q62 and charge circuits 410 and 420. If a sense amplifier according to the invention is configured in this manner, it preferably has a memory cell output detecting circuit 31 and a dummy cell output detecting circuit 32 that are symmetrically arranged. If they are not symmetrical relative to each other, the above defined conditions (4) and (7) may need to be modified to accommodate the asymmetry.

In this embodiment, the level of the input of the inverter, which constitutes the current sense circuit 41, becomes low when the level of the output of a selected memory cell is low, so the level of the output of the inverter of the circuit is consequently made high to turn on transistor Q61. On the other hand, when the level of the output of a selected memory cell is high, the level of the output of the inverter becomes high to turn off the transistor Q61.

Differently stated in this embodiment, any change in the current running along the current path between a load transistor Q11 and a selected memory cell representing the status of the memory cell output, whether in a data erased status or a data written-in status, causes the transistor Q61 to be turned on or off so that the overall operation of data reading may be carried out quickly.

when a memory cell has been selected and the level of the memory cell output is made low by the capacitance of the bit line, the output of the inverter of a charge circuit 410 is made high to make transistor Q610 conductive. Consequently, the capacitance of the bit line is quickly charged to allow a high speed data reading operation to be carried out.

Figure 10:
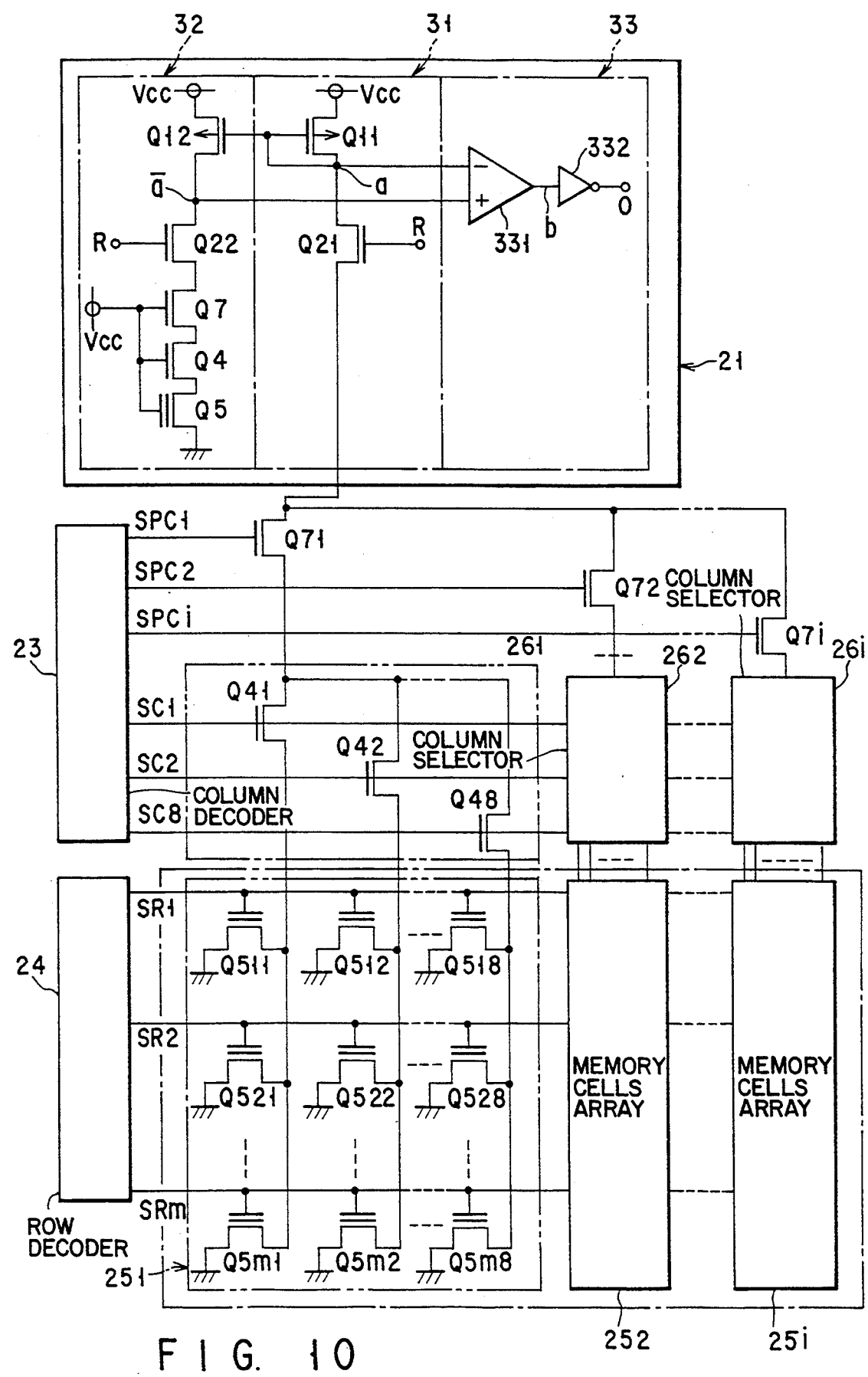
FIG. 10 is a circuit diagram of a fifth embodiment of the invention.

FIG. 10 is a circuit diagram of a fifth embodiment of the invention, wherein a memory cell section is divided into i memory cell arrays. In other words, the memory cell section comprises a total of i memory cell arrays 25*l*–25*i*, each of which has memory cells arranged in eight (n=8) columns. The bit line of each of the memory cell arrays 25*l*–25*i* is connected to respective column select circuits 26*l*–26*i*, each having transistors Q41–Q48, and one of the outputs of the column select circuit 26*l*–26*i* is selected by group select transistors Q7*l*–Q7*i* and fed to a sense amplifier 21. An appropriate transistor of the group select transistors Q7*l*–Q*i* is selected and turned on by a corresponding signal of select signals SPC1–SPCi coming from a column decoder 23.

In other words, one of the column select circuit 26*l*–26*i* is selected by the group select transistors Q7*l*–Q*i*, and the signal representing the data read out from the memory cell selected by column select signals SC1–SC8 and row select signals SR1–SRm is fed to the sense amplifier circuit 21 in the memory cell array which is connected to the selected column select circuit. In the sense amplifier circuit 21, a dummy group select transistor Q7 is connected in series to a dummy column select transistor Q4, the gate of the transistor Q7 is in turn connected to a power source Vcc.

While a two-stage decoding operation is conducted for the columns in this embodiment, it may be replaced by a three- or more than three stage decoding operation.

While P channel MOS transistors are used for the first and second load transistors Q11 and Q12 in each of the above embodiments, they may be replaced by PNP bipolar transistors.

FIG. 11 is a circuit diagram of a sixth embodiment of the invention, wherein a pair of PNP bipolar transistors are used for first and second load transistors Q110 and Q120 of a sense amplifier circuit 21, and the emitters of the transistors Q110 and Q120 are connected to a power source Vcc while the collector of the transistor Q110 is connected to column select transistors Q4*l*–Q4*n* by way of a read/write switching transistor Q21. The base of the transistor Q120 is connected to the base of the transistor Q110 while the collector of the transistor Q120 is grounded by way of a read/write switching transistor Q22 and dummy transistors Q4 and Q5 such that the transistors Q110 and Q120 form a current mirror circuit.

While EPROMs are used as memory devices in the above embodiments, they may be replaced by other devices such as mask ROMs and EEPROMs.

Thus, with a sense amplifier 21 for a semiconductor memory having a configuration as described above, output having phases inverse relative to each other can be quickly obtained to determine the status of a specific memory cell without inserting any additional circuit which may cause a response delay to occur in the signal transmission path between the memory cell output and the output evaluation circuit such as a differential amplifier circuit, allowing the sense amplifier 21 to quickly transmit the retrieved data.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A sense amplifier for receiving read outputs from a memory array comprising:

a memory cell output detector having a first load transistor, which has a control gate and which is adapted to be connected to a memory cell of said memory array;

a dummy cell output detector having a second load transistor, which has a control gate and which is adapted to be connected to a dummy cell, said first and second load transistors forming a current mirror circuit so that an output of said dummy cell output detector has a phase which is inverse to that of an output of said memory cell output detector; and sense amplifier output evaluation means, connected to said memory cell output detector and said dummy cell output detector, for amplifying a voltage difference of said output signal of said dummy cell output detector and said output signal of said memory cell output detector;

wherein said control gates of said first and second load transistors are connected to said output signal of said memory cell output detector, thereby forming said current mirror circuit.

2. A sense amplifier according to claim 1, wherein said memory array comprises memory cells that are arranged in a matrix having m row and n columns, each of said columns being adapted to be connected to said first load transistor via a column select transistor which is selected from n column select transistors by a column select signal, said dummy cell output detector being formed by connecting, in series said, dummy cells to dummy cell transistors.

3. A sense amplifier according to claim 1, wherein said memory array comprises memory cells that are arranged in a matrix of a plurality of columns and a plurality of rows, and one of said memory cells is selected by column select signals from a column decoder and row select signals from a row decoder and is connected to said memory cell output detector, and wherein dummy memory cells are adapted to be connected to each row of said memory array, and one of said dummy cells being selected by said row select signals and being connected to said second load transistor of said dummy cell output detector.

4. A sense amplifier according to claim 1, wherein said sense amplifier output evaluation means comprises differential amplifiers for receiving said output signals from said memory cell output detector and said dummy cell output detector.

5. A sense amplifier according to claim 1, wherein said memory array comprises a plurality of first EPROM transistors arranged in a matrix of a plurality of columns and a plurality of rows, and said dummy cell comprises a second EPROM transistor.

6. A sense amplifier according to claim 5, wherein said second EPROM transistor is held in a data erased state.

7. A sense amplifier according to claim 1, wherein said sense amplifier output evaluation means comprises a latch circuit for receiving said output signal from said memory cell output detector and said output of said dummy cell output detector.

8. A sense amplifier according to claim 1, wherein said first and second load transistors are each connected to a respective current sense circuit each current sense circuit comprising current sense transistors which are switched between an on state and an off state in response to changes in currents of current paths which connect said first load transistor with said memory cell and said second load transistor with said dummy cell.

9. A sense amplifier according to claim 8, wherein said current sense circuits are each connected in parallel to charge circuits, each said charge circuit comprising transistors which are switched between an on state and an off state in response to changes in currents of current paths which connect said first load transistor with said memory cells and said second load transistor with said dummy cells.

10. A sense amplifier according to claim 1, wherein said memory array is divided into a plurality of memory array groups which form a memory cell section, said memory array groups being adapted to be connected to column select circuits so that a memory cell may be selected by selecting a column of said memory cell array groups, a group of said column select circuit groups, and a row of said memory array group.

11. A sense amplifier according to claim 10, wherein an output signal of said column select circuits is adapted to be connected to group select transistors, which are controlled by signals for selecting a group of column select circuits, an output of said group select transistors being selected by a column select transistors and adapted to be connected to the first load transistor, said dummy cell and two additional dummy cells being connected in series to said second load transistor.

12. A sense amplifier according to claim 1, wherein said first and second load transistors each comprise bipolar transistors.

13. A sense amplifier according to claim 12, wherein each said bipolar transistor has a base electrode which is adopted to be said control gate.

14. A sense amplifier according to claim 1, wherein said first and second load transistors each comprise MOS transistors, each having a gate electrode which is adopted to be said control gate.

15. A sense amplifier for receiving read outputs from a memory array, said amplifier comprising:
a memory cell output detector having a first MOS transistor, which is adapted to be connected to a memory cell of said memory array and has a control gate;
a dummy cell output detector having a second MOS transistor, which is adapted to be connected to said dummy cell and has a control gate, said first and second MOS transistors forming a current mirror circuit so that an output of said dummy cell output detector has a phase that is inverse to that of an output of said memory cell output detector; and
sense amplifier output evaluation means, connected to said memory cell output detector and said dummy cell output detector, for amplifying a voltage difference of said output signal of said dummy cell output detector and said output signal of said memory cell output detector;
wherein said control gates of said first and second MOS transistors are connected to said output signal of said memory cell output detector, thereby forming said current mirror circuit, and a gate width WQ1 and a gate length LQ1 of said first MOS transistor and a gate width WQ2 and a gate length LQ2 of said second MOS transistor satisfy the relationship:

(WQ2/LQ2)>(WQ1/LQ1)

and wherein a ratio (WQ1/LQ2)/(WQ1/LQ1) is defined so as to make a resistance of said memory cell, formed by connecting said memory cell to said first MOS transistor in a data written-in state, greater than a value obtained by multiplying a resistance of said dummy cell as connected to said second MOS transistor by (WQ2/LQ2)/(WQ1/LQ1).

16. A sense amplifier for receiving read outputs from a memory array, said amplifier comprising:
a memory cell output detector having a first MOS transistor, which is adapted to be connected to a memory cell of said memory array and has a control gate;
a dummy cell output detector having a second MOS transistor, which is adapted to be connected to said dummy cell and has a control gate, said first and second MOS transistors forming a current mirror circuit so that an output of said dummy cell output detector has a phase that is inverse to that of an output of said memory cell output detector; and
sense amplifier output evaluation means, connected to said memory cell output detector and said dummy cell output detector, for amplifying a voltage difference of said output signal of said dummy cell output detector and said output signal of said memory cell output detector;
wherein said control gates of said first and second MOS transistors are connected to said output signal of said memory cell output detector, thereby forming said current mirror circuit, said memory cell and said dummy cell each comprise an EPROM transistor, said dummy cell being held in a data erased state, a gate width WQ1 and a gate length LQ1 of said first MOS transistor and a gate width WQ2 and a gate length LQ2 of said second MOS transistor satisfy the relationship (WQ2/LQ2) >(WQ1/LQ1), and a ratio (WQ1/LQ2)/(WQ1/LQ1) is defined so as to make a resistance of said memory cell, formed by connecting said memory cell to said first MOS transistor in a data written-in state, greater than a value obtained by multiplying a resistance of said dummy cell as connected to said second MOS transistor by (WQ2/LQ2)/(WQ1/LQ1).

* * * * *